(12) United States Patent
Fan et al.

(10) Patent No.: US 11,075,239 B2
(45) Date of Patent: Jul. 27, 2021

(54) ANTI-REFLECTIVE COATING WITH HIGH REFRACTIVE INDEX MATERIAL AT AIR INTERFACE

(71) Applicant: OmniVision Technologies, Inc., Santa Clara, CA (US)

(72) Inventors: Chun-Sheng Fan, Zhudong Township (TW); Chen-Wei Tsai, Xinpu Township (TW); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/816,683

(22) Filed: Mar. 12, 2020

(65) Prior Publication Data

US 2020/0335534 A1 Oct. 22, 2020

Related U.S. Application Data

(63) Continuation of application No. 15/421,879, filed on Feb. 1, 2017, now Pat. No. 10,644,048.

(51) Int. Cl.
*H01L 27/146* (2006.01)

(52) U.S. Cl.
CPC .... *H01L 27/1462* (2013.01); *H01L 27/14627* (2013.01)

(58) Field of Classification Search
CPC .......... H01L 27/1462; H01L 27/14627; H01L 51/56; H01L 51/5256; H01L 31/0203; F01D 25/007; C23C 28/322; C23C 28/324; C23C 28/345; C23C 28/3455; C23C 28/42; G02B 5/282; G02B 5/287; B32B 17/10018; B32B 17/10761; B32B 17/10788; C03C 17/42; H01S 5/18302; H01S 5/187; G02F 1/015
USPC .......... 438/24; 428/448, 446, 451, 615, 627, 428/641, 655, 663, 664
See application file for complete search history.

(56) References Cited

U.S. PATENT DOCUMENTS

| | | | |
|---|---|---|---|
| 6,387,517 B1 | 5/2002 | Belleville et al. | |
| 6,395,433 B1 | 5/2002 | Smith | |
| 9,304,237 B1* | 4/2016 | Wang | G02B 5/288 |
| 2003/0039847 A1 | 2/2003 | Dalakos | |
| 2007/0002433 A1* | 1/2007 | Chen | G02B 5/208 |
| | | | 359/359 |
| 2010/0091428 A1* | 4/2010 | Kim | H01L 23/5226 |
| | | | 361/313 |

(Continued)

OTHER PUBLICATIONS

S. Sun, L. Xie, Y. Zhang, Y. Huang, Optical properties of Ta2O5/SiO antireflection coating system, Advanced Engineering Forum, ISSN: 2234-991X, vols. 2-3, pp. 167-171 (2012), Trans Tech Publications, Switzerland.

*Primary Examiner* — Mouloucoulaye Inoussa

(57) ABSTRACT

An optical element comprising a transparent substrate and an anti-reflective coating, wherein the anti-reflective coating further comprises at least a transparent, high refractive index layer and a transparent, low refractive index layer, wherein the high refractive index layer is in contact with the low refractive index layer; and wherein the high refractive index layer is situated at an interface between the anti-reflective coating and air. Further, the low refractive index layer may be silicon oxide; the high refractive index layer may be tantalum oxide or silicon nitride.

20 Claims, 12 Drawing Sheets

(56) References Cited

U.S. PATENT DOCUMENTS

2011/0280717 A1 11/2011 Wada et al.
2013/0038764 A1* 2/2013 Takachi ............ H01L 27/14685
                                                    348/294
2013/0334511 A1 12/2013 Savas et al.
2016/0116835 A1* 4/2016 Kim ......................... G03F 1/24
                                                    430/5

* cited by examiner

ANTI-REFLECTIVE COATING WITH HIGH REFRACTIVE INDEX MATERIAL AT AIR INTERFACE

CROSS-REFERENCE TO RELATED APPLICATION

This application is a continuation of U.S. patent application Ser. No. 15/421,879, filed Feb. 1, 2017.

FIELD OF INVENTION

The current invention relates to anti-reflective (AR) coating of an image sensor. In particular, the anti-reflective coating is a multi-layer coating, which alternates between a harder, high refractive index material and softer, low refractive index material, with the high refractive index material situated at the air interface between the AR coating and air.

BACKGROUND

AR coating is widely used in image sensors. It is generally applied on top of a cover glass or a lens, and is situated with its air interface facing incoming light. As shown in FIG. 9, a packaged complementary metal oxide semiconductor (CMOS) image sensor package 900 includes a cover glass 910, a CMOS image sensor (CIS) device 930 that comprises microlens (not shown), substrate, photo detection regions (not shown), and metal connect regions (not shown), dams 940, and solder balls 950. The top of the cover glass 910 is coated with an AR coating 920, which is situated with its air interface facing incoming light.

One type of AR coating is a multi-layer coating, consisting of multiple layers of high and low refractive index materials. Based on the principle of destructive interference, the multi-layer AR coating works to reduce light reflection to be within only a few percent of incoming light, so that optical transmission is enhanced.

DETAILED DESCRIPTION

Embodiments disclosed below describe an AR coated cover glass as part of an image sensor package. Particular embodiments relate to multi-layer AR coatings, with alternating layers of high and low refractive index materials. In some embodiments, a high index material layer is the outermost layer, situated at the air interface.

An image sensors optical elements, such as its cover glass and lens, are generally made of transparent, glass (or plastic) materials. These materials generally have a reflectance of several percent (e.g., 4%), i.e., they reflect a certain percentage (e.g., 4%) of the incoming light. To reduce the reflectance and increase the transmittance (which is defined as 100% minus the reflectance), a relatively low refractive index material may be used to coat the optical elements. This is similar to the practice of index matching.

The general principle of light reflection is described below.

Generally speaking, a material's refractive index increases with its density. Air has a density of 0.0013 g/cm3, and a refractive index of 1; silicon oxide (SiO2) has a higher density of 2.65 g/cm3, and a higher index of 1.46; tantalum oxide (Ta2O5) has an even higher density of 8.2 g/cm3, and an even higher index of 2.13.

At the air interface of a dense material (such as glass), one the side of air, the refractive index of air is $n_0=1$; on the dense material side, the refractive index of the dense material is always $n_1>1$. The reflectance R of the incoming light (incoming air is defined as coming inside the air medium and reflecting off the dense material surface) may be calculated with the following formula:

$$R = \left(\frac{n_0 - n_1}{n_0 + n_1}\right)^2 \times 100\%$$

For example, if the dense material is SiO2, with its refractive index of 1.46, the reflectance will be 3.5%, which is lower than the 4% glass reflectance. If the material is an even denser material such as Ta2O5, with its high refractive index of 2.13, the reflectance will be 13%, which is much higher than the 4% glass reflectance.

One type of AR coating may be a single layer of low-index material (such as SiO2). Another type of AR coating may have multiple layers of transparent materials. For a multi layer AR coating, multiple alternating layers of two transparent materials, e.g., SiO2 and Ta2O5, form a composite, layered AR coating. Both materials have refractive indexes that are greater than that of the air, and the refractive index of SiO2 is less than that of Ta2O5. Conventionally, SiO2 is referred to as a low-index material, and Ta2O5 is referred to as a high index material.

Figure 1:
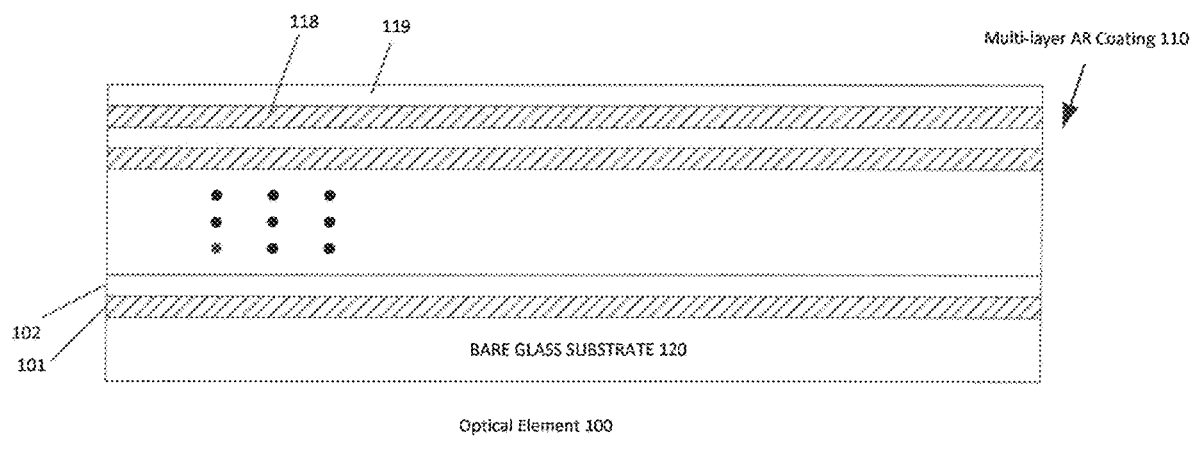
FIG. 1 is the cross sectional view of a mufti-layer anti-reflective (AR) coating, showing the conventional design of placing a low-index material at the air interface.

FIG. 1 is the cross sectional view of an optical element 100 (such as a cover glass), including a bare glass substrate 120, which is coated with a multi-layer AR coating 110. The mufti-layer AR coating 110 includes alternating layers, numbered as 101, 102, etc., wherein the innermost layer 101 is situated directly above bare glass substrate 120. The numbering of a layer goes up as the layer is further away from the bare glass substrate 120. For a 19 layer AR coating, the highest numbered layer 119 is the outermost layer, which is situated at the air interface.

The layers 101, 102, . . . , and 119 are alternating layers of the low-index SiO2 and the high-index Ta2O5. As incoming light first passes through the air interface, and then passes through each of the multiple layers, reflection occurs at each interface, i.e., first at the interface between air and layer 119, then at the interface between layers 119 and 118, . . . , at the interface between layers 102 and 101, and finally at the interface between layer 101 and the bare glass substrate 120. Appropriate design of both the thickness and the refractive index of each layer is made to promote destructive interference to occur for each reflection, thereby rendering the overall reflection of the AR coating to be a low value.

Theoretically speaking, for the aforementioned multilayer AR coating, the reflectance at a SiO2-Ta2O5 interface is about 5%. At the interface between air and the outermost layer 119, the reflectance depends on the refractive index of that outermost layer 119. FIG. 1 shows a conventional design that places the low-index SiO2 as the outermost layer 119 at the air interface. This is the conventional design, because the air-SiO2 interface has a reflectance of only 3.5%. This low reflectance will help to keep the overall reflectance of the multi-layer AR coating at a low value. In contrast, an air-Ta2O5 interface has a 13% reflectance. If the outermost layer 119 is the high-index Ta2O5, then it will be difficult to keep the overall multi-layer AR coating reflectance to a low value, due to the high reflectance at the air-Ta2O5 interface.

Despite the conventional wisdom, positioning a SiO2 layer as the outermost layer at the air interface has its shortcoming, in part because SiO2 has a low hardness level (Mohs hardness index for SiO2 is around 6 to 7). This renders the AR coating susceptible to scratch damage. Even when the top SiO2 layer thickness is increased, the scratch problem still persists. For example, a pencil scratch test uses different hardness pencils (1H to 9H, wherein a higher H number represents a harder pencil lead) to scratch a multilayer AR coated cover glass. When the outermost AR layer is SiO2 (the design in FIG. 1), the pencil scratch test fails at 2H and higher. A solution to this scratch damage problem is to place the harder Ta2O5 (Mohs hardness index is around 9.2) at the outermost air-interface layer, but additional design features need to be implemented, as disclosed below.

Figure 2:
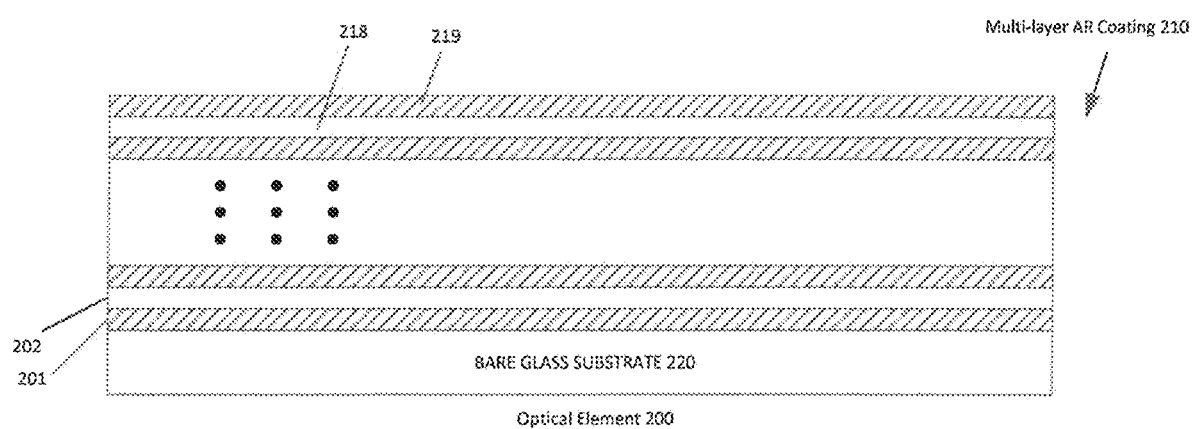
FIG. 2 is the cross sectional view of a multi-layer AR coating, with a high-index material at the interface.

FIG. 2 is the cross sectional view of another type of multi-layer AR coating, which has a high-index material (e.g., Ta2O5) positioned at the air interface. More specifically, an optical element 200 (such as cover glass) includes a bare glass substrate 220, and a multilayer AR coating 210 that coats the bare glass substrate 220. The multi-layer AR coating 210 includes alternating layers, numbered as 201, 202, etc., with the innermost layer 201 situated directly above bare glass substrate 220 as shown. The numbering of a layer goes up as the layer is further away from the bare glass substrate 220. For a 19 layer AR coating, the highest numbered layer 219 is the outermost layer, and is situated at the air interface.

In this embodiment, the innermost (first) layer 201 is Ta2O5, the next (second) layer 202 is SiO2, and so on. The layers alternate between SiO2 and Ta2O5. For the outer layers near the air interface, the eighteenth layer 218 is SiO2, whereas the outermost nineteenth layer 219 is Ta2O5. Since Ta2O5 (9.2 Mobs hardness index) is much harder than SiO2 (6-7 Mohs hardness index), optical element design 200 in FIG. 2 (whose outermost layer is Ta2O5) is more scratch resistant than optical element design 100 in FIG. 1 (whose outermost layer is SiO2). Notably, Ta2O5 has a higher refractive index (n=2.13) than SiO2 (n=1.46), making the outermost layer 219 relatively more susceptible for reflection. This issue is dealt with, in part, by controlling the outermost layer thickness to be around 1 to 2 nm, along with additional design features to control the other layer thicknesses to be around certain values, as disclosed below.

Table 1 shows an AR coating design wherein the outermost nineteenth layer is a one nanometer Ta2O5 layer. It shows the inner most Layer 1 (layer 201 in FIG. 2) as an 11.9 nm Ta2O5 layer, the next Layer 2 (layer 202 in FIG. 2) as a 49.6 nm SiO2 layer, and so on. Near the air interface, the eighteenth Layer 18 (layer 218 in FIG. 2) is an 85.3 nm SiO2 layer, and the outermost nineteenth Layer 19 (layer 219 in FIG. 2) is a one nanometer (with a 5-10% variation) Ta2O5 layer,

TABLE 1

Multi-layer AR Coating Design

| Layer No. | Material | Thickness |
|---|---|---|
| Layer 1 | Ta2O5 | 11.9 nm |
| Layer 2 | SiO2 | 49.6 nm |
| Layer 3 | Ta2O5 | 25.8 nm |
| Layer 4 | SiO2 | 5.2 nm |
| Layer 5 | Ta2O5 | 7.9 nm |
| Layer 6 | SiO2 | 11 nm |
| Layer 7 | Ta2O5 | 77.4 nm |
| Layer 8 | SiO2 | 11 nm |
| Layer 9 | Ta2O5 | 31.7 nm |
| Layer 10 | SiO2 | 4.3 nm |
| Layer 11 | Ta2O5 | 5.9 nm |
| Layer 12 | SiO2 | 81.3 nm |
| Layer 13 | Ta2O5 | 7.94 nm |
| Layer 14 | SiO2 | 61.5 nm |
| Layer 15 | Ta2O5 | 43.7 nm |
| Layer 16 | SiO2 | 5.1 nm |
| Layer 17 | Ta2O5 | 65.5 nm |
| Layer 18 | SiO2 | 85.3 nm |
| Layer 19 | Ta2O5 | 1 nm |

Figure 3:
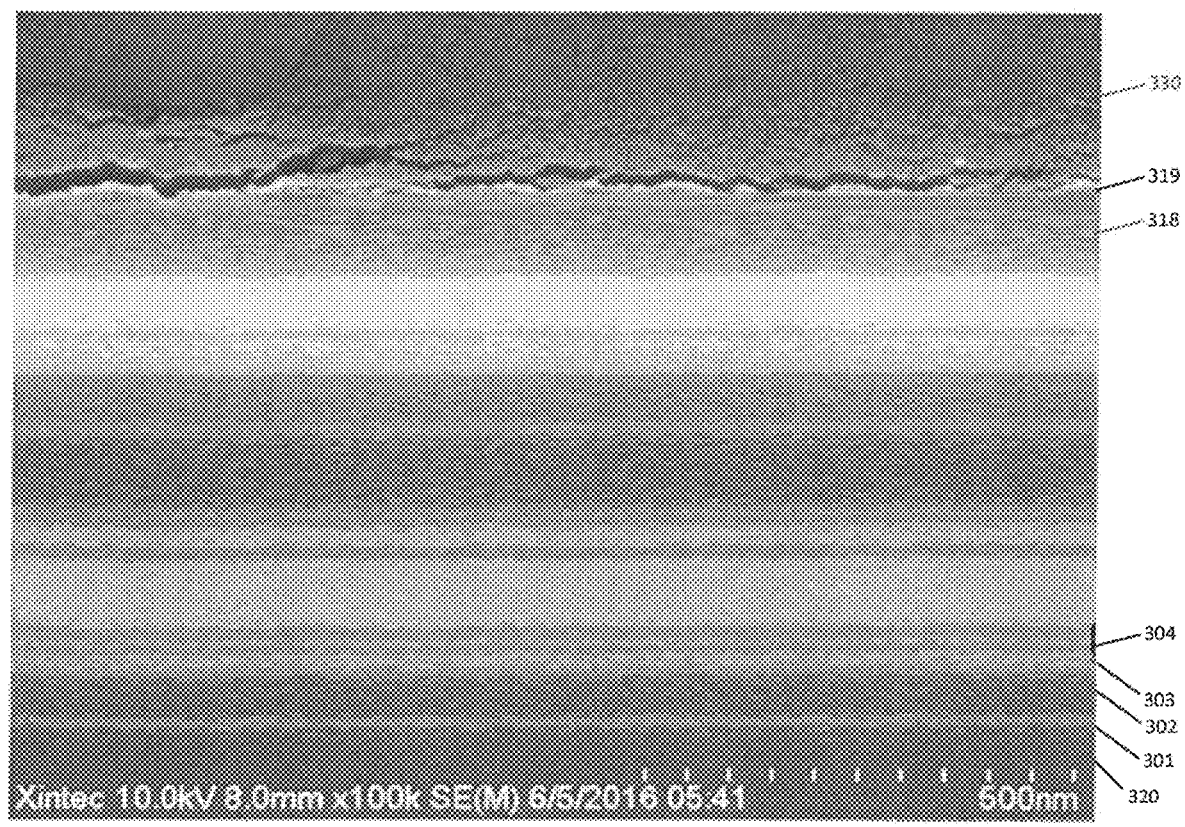
FIG. 3 is an actual scanning electron microscope (SEM) image of a cross section of an AR coating, showing alternating layers of tantalum oxide Ta2O5 and silicon dioxide SiO2, with the high-index Ta2O5 layer situated at the air interface.

FIG. 3 is a perspective view of an actual scanning electron microscope (SEM) image showing a cross section of the AR coating as described in Table 1. A cover glass, coated with a multi-layer AR coating as described in Table 1, is covered with an encapsulating agent (such as epoxy, for SEM imaging purpose only), and then cross sectioned for SEM. FIG. 3 shows alternating layers of tantalum oxide Ta2O5 (lighter colored layers) and silicon dioxide SiO2 (darker colored layers). Specifically, on top of bare glass substrate 320 is the first layer 301 of Ta2O5, with a thickness of 11.9 nm. Next is the second layer 302 of SiO2, with a thickness of 49.6 nm. A third layer 303 of Ta2O5, with a thickness of 25.8 nm is on top of the second layer 302 and a fourth layer 304 of SiO2, with a thickness of 5.2 nm, is on top of the third layer 303. Alternating layers of Ta2O5 and SiO2 as described Table 1 are shown in FIG. 3. Near the top (air interface) is the eighteenth layer 318 of SiO2, with a thickness of 85.3 nm. An outermost, nineteenth layer 319 is Ta2O5, with a thickness of only one nanometer. An encapsulating layer of epoxy 330 lies on top of the top Ta2O5 layer 319, and partially obscures this very thin, nineteenth layer 319 of Ta2O5.

This design, wherein the outermost layer is a thin (1-2 nm) Ta2O5 layer, has several advantages.

First, it works well to protect the AR coating from scratch damage. When the same pencil scratch test as described above is applied to this AR coating (e.g., the design in Table 1 and FIG. 3), the AR coating is able to pass even the hardest 9H pencil test without being scratched.

Figure 4A:
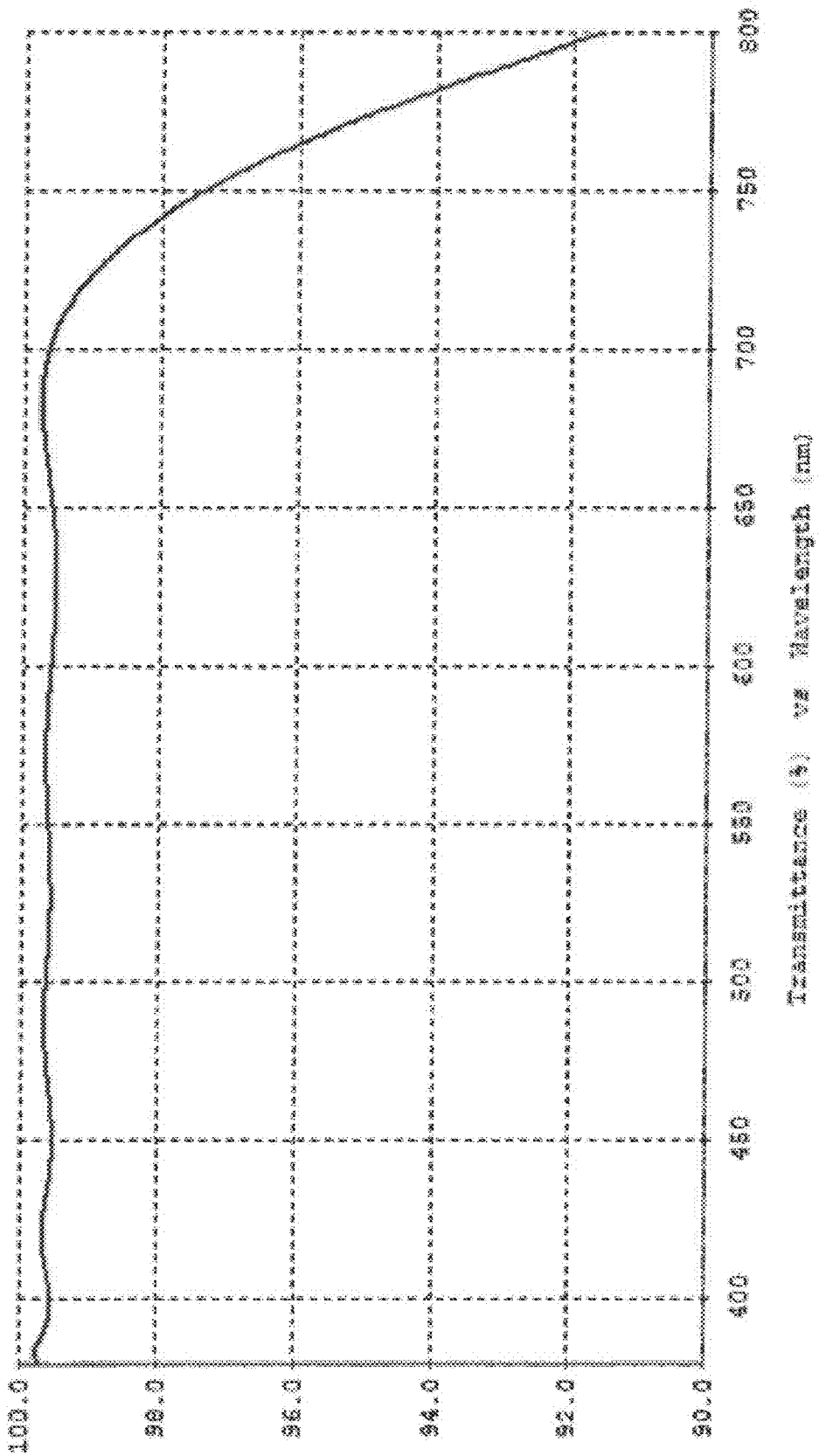
FIG. 4A is a wavelength vs. transmittance measurement plot of a multi-layer Ta2O5/SiO2 AR coating, with a one nanometer high-index Ta2O5 outermost layer situated at the air interface.
Figure 4B:
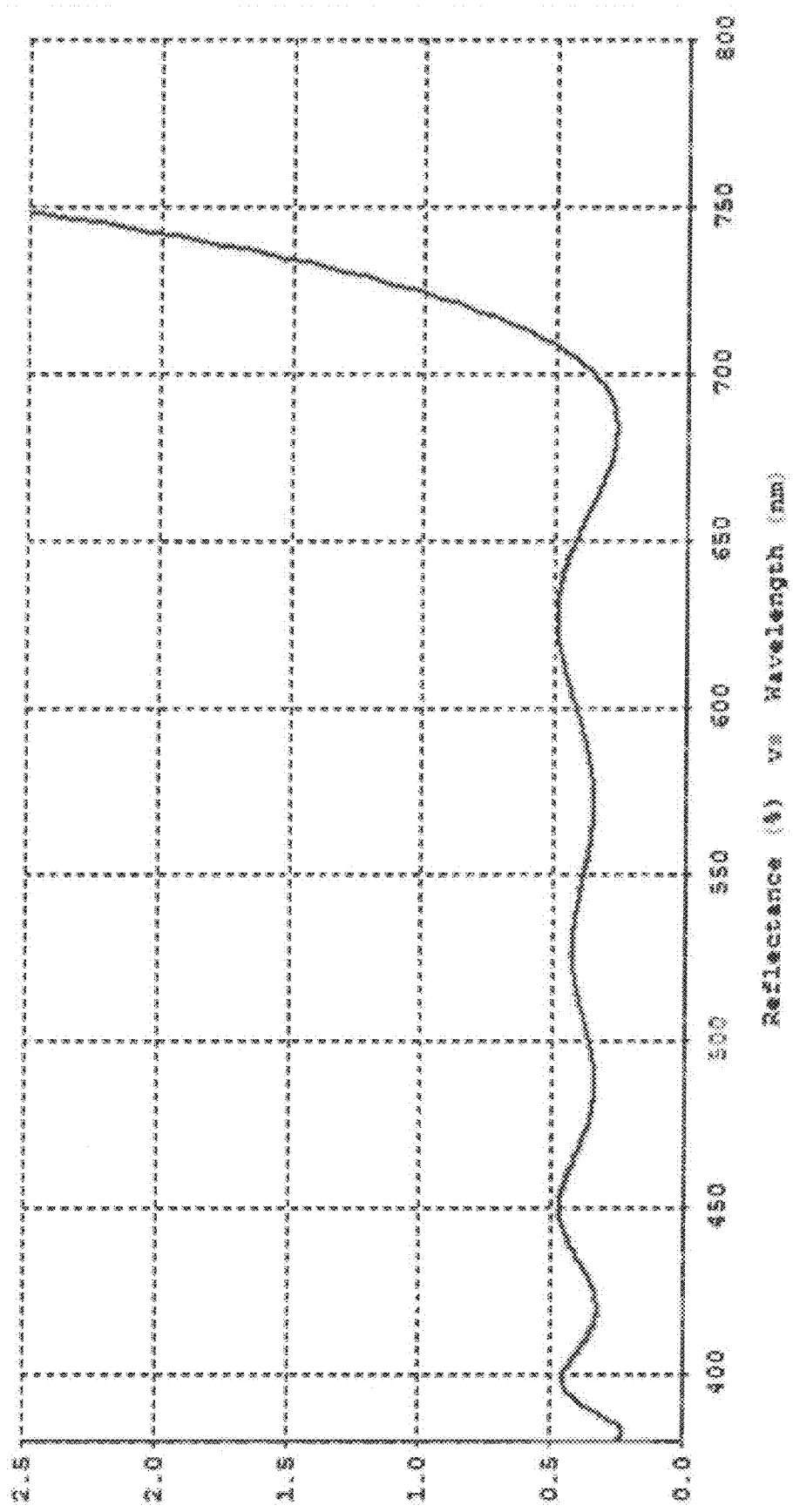
FIG. 4B is a wavelength vs. reflectance measurement plot of a multi-layer Ta2O5/SiO2 AR coating, with a one nanometer high-index Ta2O5 outermost layer situated at the air interface.

Second, it allows for high transmittance and low reflection, which are attributes of a good AR coating performance. FIG. 4A is a wavelength vs. transmittance measurement plot of this AR film design. It shows a high transmittance (about 99%) for a wavelength range of about 380-700 nm (almost, the entire visible spectrum). FIG. 4B is a wavelength vs. reflectance measurement plot of this AR film design. It shows a low reflectance (below 0.5%) for a wavelength range of about 380-700 nm.

Third, this design provides for high transmittance and low reflectance even for low wavelength values of below 400 nm, which is close to the ultraviolet domain.

Notably, the outermost layer of Ta2O5 needs to very thin, generally about 1-2 nm (with a 5-10% variation). If this layer thickness is below 1 nm, it will be relatively difficult to precisely form such a thin layer with currently market-available coating, technology such as vapor deposition and sputtering. Also, the protection that this thin Ta2O5 may offer against scratch damage will be reduced. On the other hand, if this Ta2O5 layer thickness is increased (e.g., 5 nm or more), performance of the entire multi-layer AR coating will diminish significantly, because transmittance will decrease, and reflectance will increase to approach unacceptable levels. In order for an AR coasting to perform well, transmittance should be kept high and reflectance should be kept low. The following data shows that when the outermost layer of Ta2O5 is above 2 nm, AR coating performance will be substantially diminished.

Figure 5A:
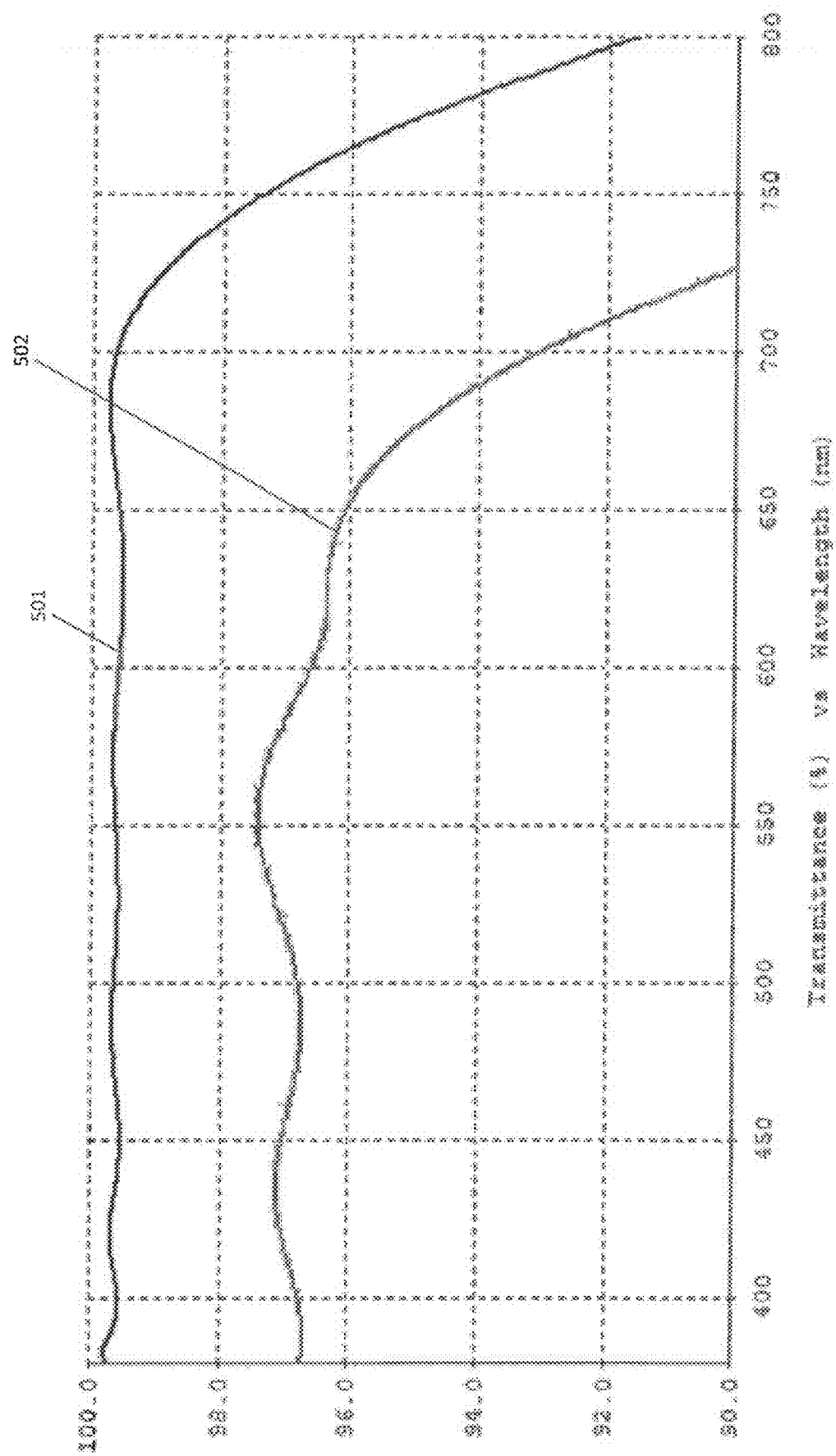
FIG. 5A is a plot of wavelength vs. transmittance of a multi-layer Ta2O5/SiO2 AR coating, with the high-index Ta2O5 outermost layer situated at the air interface. Transmission performances of two thicknesses of the outermost Ta2O5 layer are compared.
Figure 5B:
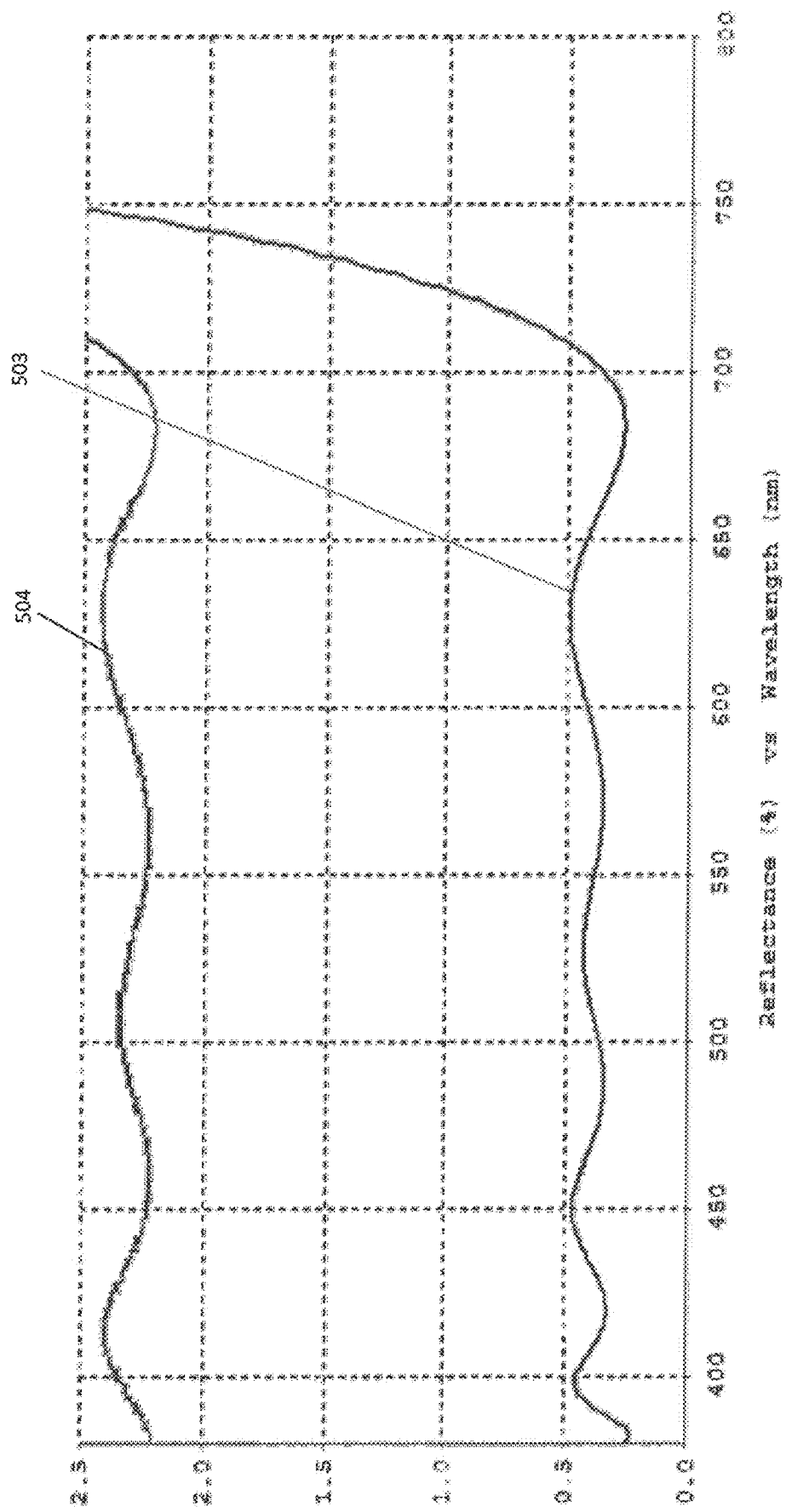
FIG. 5B is a plot of wavelength vs. reflectance of a multi-layer Ta2O5/SiO2 AR coating, with the high-index Ta2O5 outermost layer situated at the air interface. Reflectance performances of two thicknesses of the outermost Ta2O5 layer are compared.

FIG. 5A is a wavelength vs. transmittance measurement plot that compares a performance curve 501 of an AR coating with a 1 nm Ta2O5 outermost layer with a performance curve 502 of an AR coating with a 2 nm Ta2O5 outermost layer. Curve 501 shows that when the outermost Ta2O5 layer is 1 nm, the AR film's transmittance is above 99% for the 380-700 nm visible wavelength range. In contrast, curve 502 shows that when the outermost Ta2O5 layer is increased to 2 nm, the AR film's transmittance is substantially reduced to about 97%. FIG. 5B is a wavelength vs. reflectance measurement plot that compares a performance curve 503 of an AR coating with, a 1 nm Ta2O5 outermost layer with a performance curve 504 of art AR coating with a 2 nm Ta2O5 top layer. Curve 503 shows that when the topmost Ta2O5 layer is 1 nm, the AR film's reflectance is below 0.5% for the 180-700 nm visible wavelength range. In contrast, curve 504 shows that when the outermost Ta2O5 layer is increased to 2 nm, the AR film's reflectance is substantially increased to over 2%. These data support keeping the outermost Ta2O5 layer thickness to be ideally less than or equal to 2 nm.

Besides Ta2O5, silicon nitride (Si3N4) may also be used as an outermost layer. Si3N4 has a hardness (Mohs index=8.5) that is significantly higher than that of SiO2, and is similar to that of Ta2O5. In addition, the refractive index of Si3N4 around 2.016, which is similar to Ta2O5. Using Si3N4 to replace Ta2O5 will form a multi-layer AR coating that has a similar optical performance as the previously disclosed multi-layer Ta2O5/SiO2 AR coating.

Figure 6A:
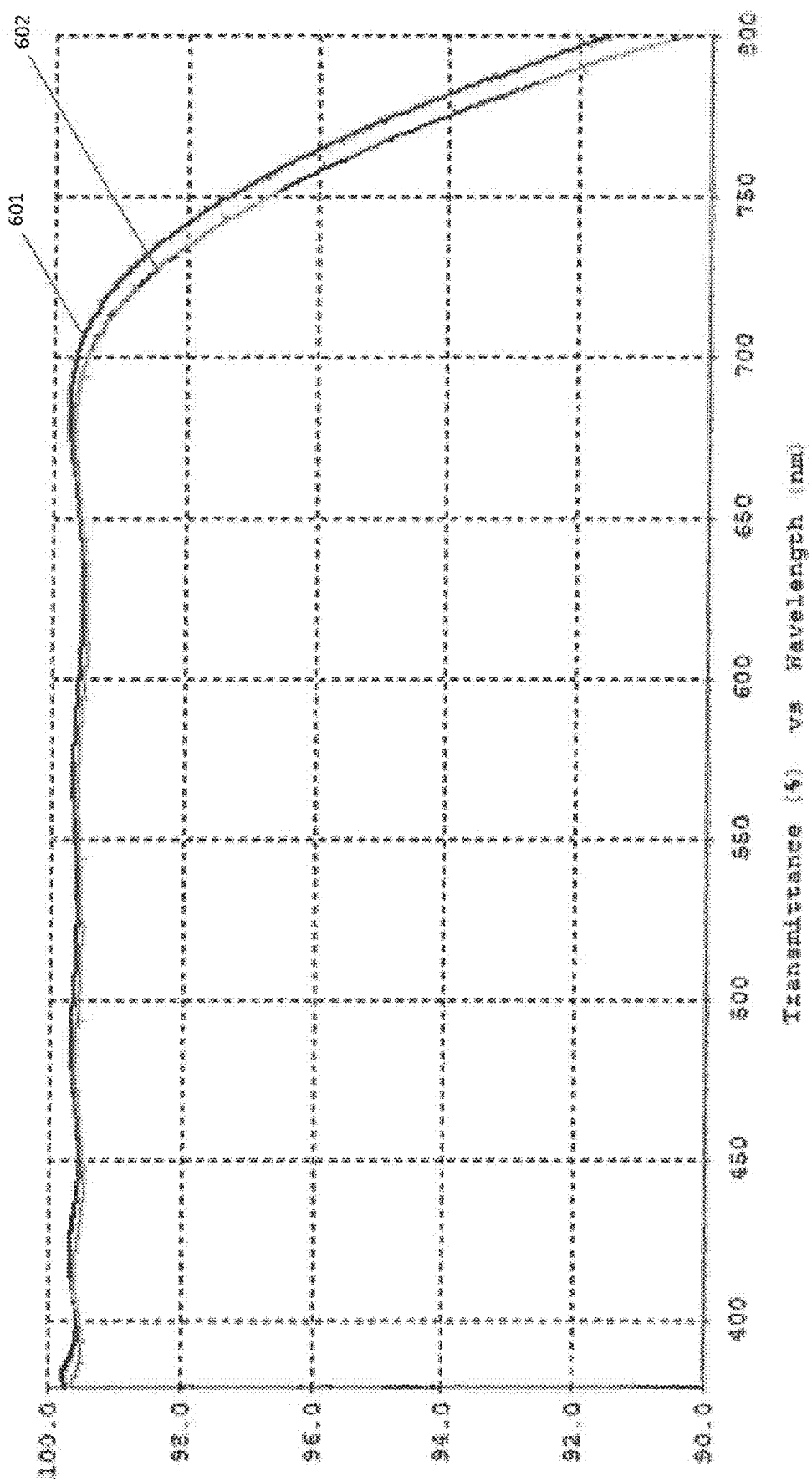
FIG. 6A is a plot of wavelength vs. transmittance of a multi-layer AR coating, with the high-index outermost layer situated at the air interface. Transmission performances of two high-index materials, Ta2O5 and Si3N4, at the outermost layer are compared.
Figure 6B:
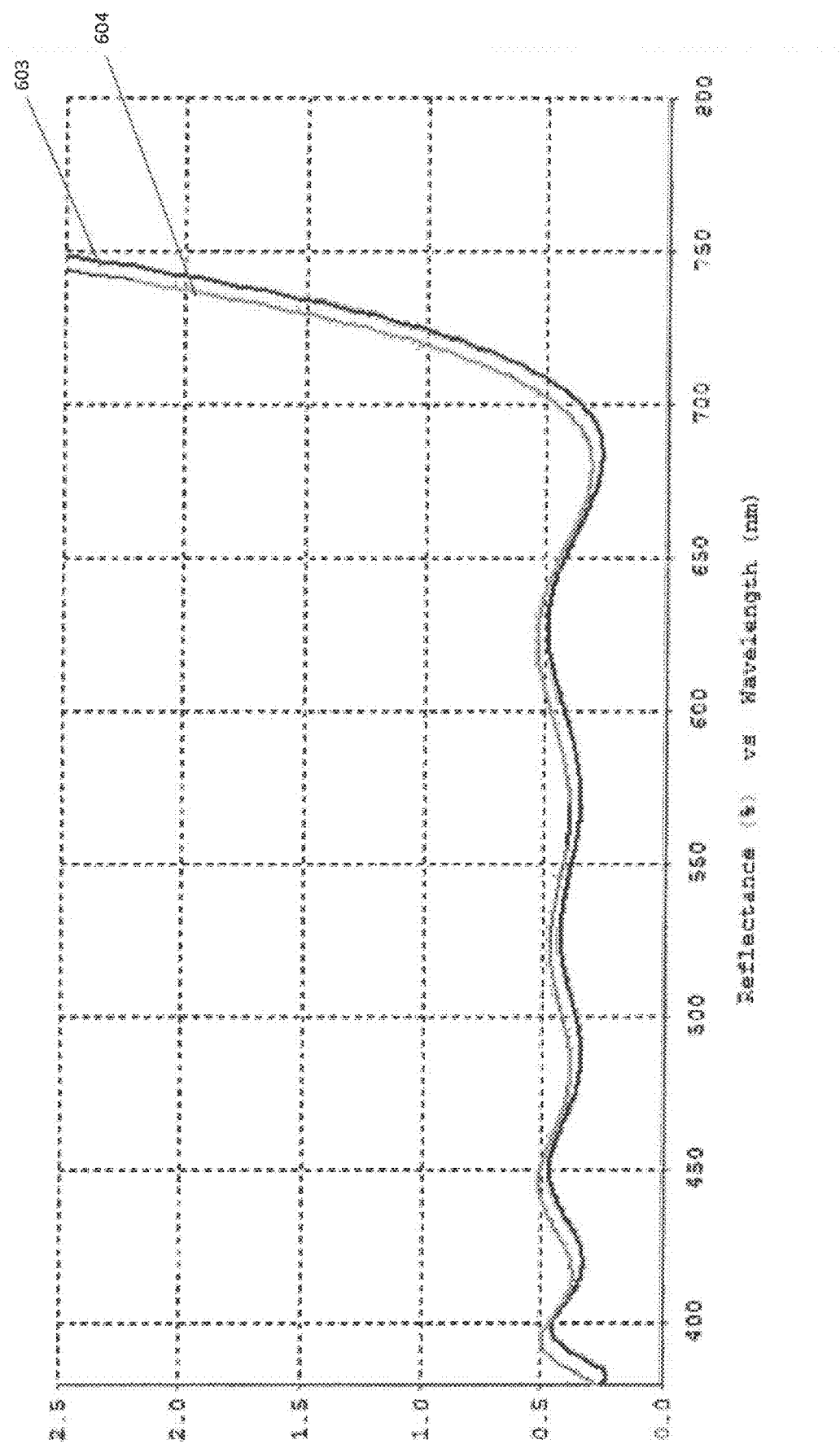
FIG. 6B is a plot of wavelength vs. reflectance of a multi-layer AR coating, with the high-index outermost layer situated at the air interface. Reflectance performances of two high-index materials. Ta2O5 and Si3N4, at the outermost layer are compared.

FIG. 6A is a wavelength vs. transmittance measurement plot that shows a performance curve 601 of an AR coating with a 1 nm Ta2O5 outermost layer being similar to a performance curve 602 of an AR coating w the a 1 nm Si3N4 outermost layer. FIG. 6B is a wavelength vs. reflectance measurement plot that shows a performance curve 603 of an AR coating with a 1 nm Ta2O5 outermost layer being similar to a performance curve 602 of an AR coating with a 1 nm Si3N4 outermost layer. These data support using Si3N4 in place of Ta2O5 to form a multi-layer AR coating with SiO2. It should be noted that Si3N4 is less resistant to chemical erosion than Ta2O5.

Figure 7:
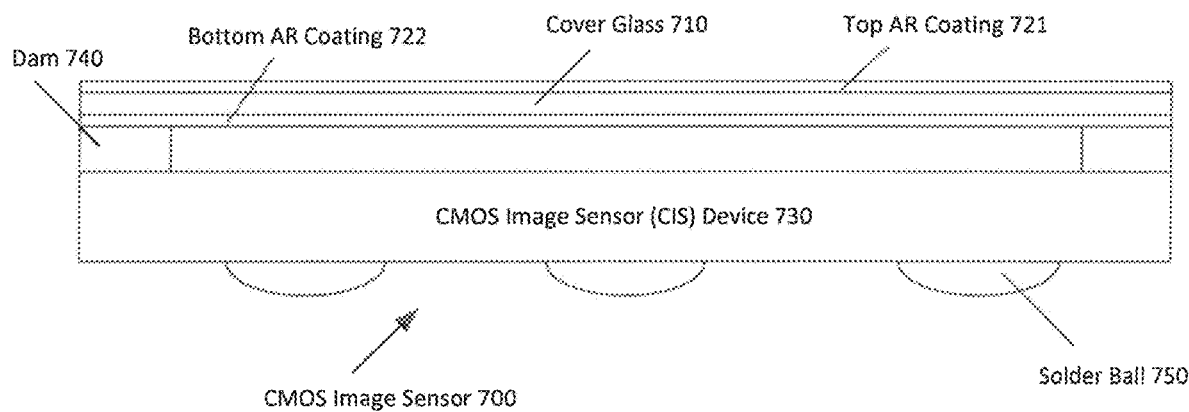
FIG. 7 is a schematic drawing of an image sensor package including an AR coated cover glass, showing the AR coatings on both sides of the cover glass.
Figure 9:
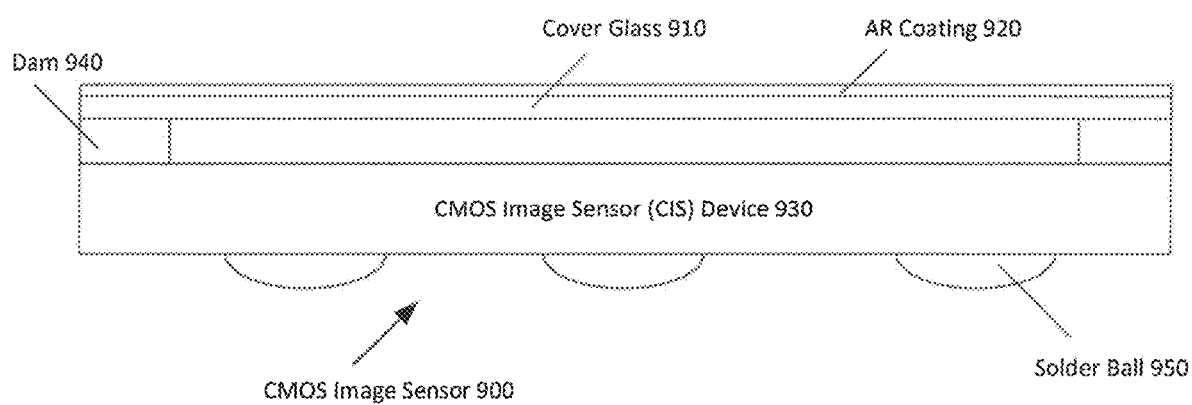
FIG. 9 shows an image sensor package, with an AR coated cover glass.

As disclosed above, a special, multi-layer (e.g., alternating Ta2O5/SiO2 layers) AR coating with a thin (e.g., 1-2 nm, with a 5-10% variation), high refractive index material (e.g., Ta2O5) at the outermost laser (i.e., at the air interface) may be used to achieve good anti-reflection performance. This special AR coating may be applied to the outer surface of a cover glass of an image sensor package, as shown in FIG. 9. The AR coating may also be applied to both sides of a cover glass. FIG. 7 shows such a design. It is a packaged CMOS image sensor 700 that includes a cover glass 710, a CIS device 730 that comprises microlens (not shown), substrate, photo detection regions (not shown), and metal connect regions (not shown), dams 740, and solder balls 750. The cover glass 710 is coated on both sides with a top-side AR coating 721 and a bottom-side AR coating 722.

Figure 8:
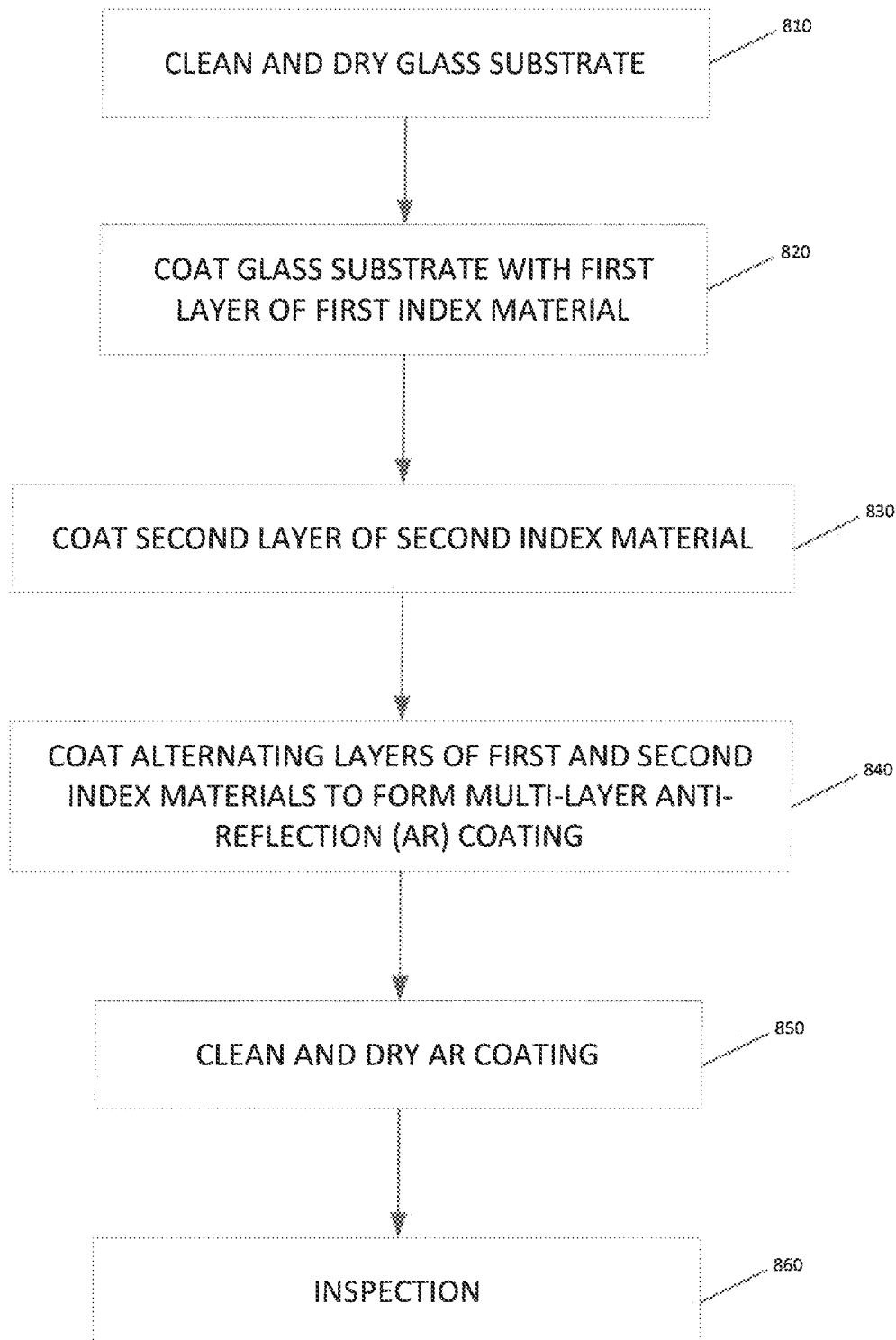
FIG. 8 shows a process of limning AR coating on a bare glass substrate, including the main steps of the process.

A multi-layer AR coating may be formed onto a bare glass substrate in steps as laid out in FIG. 8. First in step 810, a bare glass substrate is cleaned and dried. Then, in step 820, the bare glass substrate is coated with a first layer of a first index material. For example, the glass substrate is coated with a first layer of a high refractive index material tantalum oxide. Next, in step 830, a second layer of a second index material is added. For example, a second layer of a low refractive index material silicon oxide may be added on top of the first layer. Alternatively, the first layer may be a low index material such as silicon oxide, and the second layer may be a high index material tantalum oxide.

In the next set of steps 840, alternating layers of the first and second index materials are consecutively formed on top of each other, so as to form a multi-layer AR coating. For example, alternating layers of tantalum oxide and silicon oxide are consecutively formed on top of each other. The final layer, which is the outermost layer at the air interface, may be a nineteenth layer of tantalum oxide. Notably this layers thickness may have a range of 1-2 nm. After the formation of the multi-layer AR coating, this coating is cleaned and dried in step 850, and then inspected in step 860.

Forming each high or low index layer may be accomplished by a coating apparatus that operates with methods such as vapor deposition and sputtering. Generally speaking, vapor deposition is not as precise as sputtering in order to control coating layer thickness. This is partly because in vapor deposition, the distance between a target (i.e., source of metal) and substrate (i.e., bare glass substrate) is often more than 12.0 cm. Therefore, even after deposition is stopped, ionized atoms in the 120 cm space will continue to deposit onto the substrate for some time, causing the coating layer to be thicker than the desired value. Sputtering does not have this issue, and is the preferred method to form a thin layer of AR coating, e.g., the 1-2 nm, outermost Ta2O5 layer at the air interface.

For a coating apparatus (e.g., a sputter coater), a layer thickness monitor is an essential element. This may be a quartz crystal monitor, which operates based on the principle of a quartz crystal microbalance. When individual atoms deposit onto a quartz crystal oscillator, its oscillation frequency may change accordingly. This quartz crystal oscillator may be pre-calibrated, together with an actual coating substrate such as a bare glass substrate, to establish the relationship between oscillation frequency and coating layer thickness. This post-calibrated quartz crystal oscillator is then incorporated as part of the layer thickness monitor. In this manner, a high level of coating accuracy, e.g., 0.001 angstrom per second, may be achieved. A layer thickness of 1-2 nm may be accomplished by using a coating apparatus that utilizes this type of layer thickness monitor. Error range of coating, thickness is controlled to be within 5-10%.

The above description of illustrated embodiments of the invention, including what is described in the abstract, is not intended to be exhaustive or to limit the invention to the exact forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be interpreted to limit the invention to the specific embodiments disclosed in the specification and the claims. Rather, the scope of the invention is to be determined entirely by the following claims, which are interpreted in accordance with established doctrines of claim interpretation.

What is claimed is:

1. An optical element comprising a transparent substrate and an anti-reflective coating, wherein the anti-reflective coating further comprises:
    at least a transparent, high refractive index layer and a transparent, low refractive index layer,
    wherein the high refractive index layer is in contact with the low refractive index layer;
    wherein the high refractive index layer is situated at an interface between the anti-reflective coating and air;
    wherein destructive interference occurs for all reflections at interfaces including reflection at an interface between air and the high refractive index layer, and reflection at an interface between the high refractive index layer and the low refractive index layer;
    wherein the high refractive index layer has a thickness that has a range that is substantially equal to 1-2 nm; and
    wherein the anti-reflective coating is based on destructive interference.

2. The optical element of claim 1, wherein the anti-reflective coating comprises a low refractive index layer situated directly above the transparent substrate, and wherein destructive interference occurs for all reflections at interfaces further including reflection at an interface between the layer situated directly above the transparent substrate and the transparent substrate.

3. The optical element of claim 1, wherein the anti-reflective coating further comprises a high refractive index layer situated directly above the transparent substrate, and wherein destructive interference occurs for all reflections at interfaces further including reflection at an interface between the layer situated directly above the transparent substrate and the transparent substrate.

4. The optical element of claim 1, wherein the low refractive index layer is a silicon dioxide layer.

5. The optical element of claim 1, wherein the high refractive index layer is a tantalum oxide layer.

6. The optical element of claim 1, wherein the high refractive index layer is a silicon nitride layer.

7. The optical element of claim 1, wherein the anti-reflective coating comprises seventeen, additional alternating layers of transparent high refractive index and low-refractive index materials.

8. The optical element of claim 7, wherein the additional seventeen layers, the high refractive index layer, and the low refractive layer form nineteen layers having thicknesses:

| Layer No. | Material | Thickness |
| --- | --- | --- |
| Layer 1 | Ta2O5 | 11.9 nm |
| Layer 2 | SiO2 | 49.6 nm |
| Layer 3 | Ta2O5 | 25.8 nm |
| Layer 4 | SiO2 | 5.2 nm |
| Layer 5 | Ta2O5 | 7.9 nm |
| Layer 6 | SiO2 | 11 nm |
| Layer 7 | Ta2O5 | 77.4 nm |
| Layer 8 | SiO2 | 11 nm |
| Layer 9 | Ta2O5 | 31.7 nm |
| Layer 10 | SiO2 | 4.3 nm |
| Layer 11 | Ta2O5 | 5.9 nm |
| Layer 12 | SiO2 | 81.3 nm |
| Layer 13 | Ta2O5 | 7.94 nm |
| Layer 14 | SiO2 | 61.5 nm |
| Layer 15 | Ta2O5 | 43.7 nm |
| Layer 16 | SiO2 | 5.1 nm |
| Layer 17 | Ta2O5 | 65.5 nm |
| Layer 18 | SiO2 | 85.3 nm |
| Layer 19 | Ta2O5 | 1 nm; | wherein layer 19 is the high refractive index layer situated at an interface between the antireflective coating and air; and wherein the high refractive index layer is a tantalum oxide (Ta2O5) layer, and the low refractive index layer is a silicon dioxide (SiO2) layer.

9. The optical element of claim 1, wherein the transparent substrate is a bare glass substrate.

10. The optical element of claim 1, wherein the anti-reflective coating is applied to both sides of the transparent substrate.

11. An image sensor package comprising a CMOS image sensor and an optical element, wherein the optical element further comprises a transparent substrate and an anti-reflective coating, wherein the anti-reflective coating further comprises:
    at least a transparent, high refractive index layer and a transparent, low refractive index layer, wherein the high refractive index layer is in contact with the low refractive index layer;
    wherein the high refractive index layer is situated at an interface between the anti-reflective coating and air;
    wherein destructive interference occurs for all reflections at interfaces including reflection at an interface between air and the high refractive index layer, and reflection at an interface between the high refractive index layer and the low refractive index layer;
    wherein the high refractive index layer has a thickness that has a range that is substantially equal to 1-2 nm; and wherein the anti-reflective coating is based on destructive interference.

12. The image sensor package of claim 11, wherein the anti-reflective coating comprises a low refractive index layer situated directly above the transparent substrate, and wherein destructive interference occurs for all reflections at interfaces further including reflection at an interface between the layer situated directly above the transparent substrate and the transparent substrate.

13. The image sensor package of claim 11, wherein the anti-reflective coating further comprises a high refractive index layer situated directly above the transparent substrate, and wherein destructive interference occurs for all reflections at interfaces further including reflection at an interface between the layer situated directly above the transparent substrate and the transparent substrate.

14. The image sensor package of claim 11, wherein the low refractive index layer is a silicon dioxide layer.

15. The image sensor package of claim 11, wherein the high refractive index layer is a tantalum oxide layer.

16. The image sensor package of claim 11, wherein the high refractive index layer is a silicon nitride layer.

17. The image sensor package of claim 11, wherein the anti-reflective coating comprises seventeen, additional alternating layers of transparent high refractive index and low-refractive index materials.

18. The image sensor package of claim 17, wherein the additional seventeen layers, the high refractive index layer, and the low refractive layer form nineteen layers having thicknesses:

| Layer No. | Material | Thickness |
|---|---|---|
| Layer 1 | Ta2O5 | 11.9 nm |
| Layer 2 | SiO2 | 49.6 nm |
| Layer 3 | Ta2O5 | 25.8 nm |
| Layer 4 | SiO2 | 5.2 nm |
| Layer 5 | Ta2O5 | 7.9 nm |
| Layer 6 | SiO2 | 11 nm |
| Layer 7 | Ta2O5 | 77.4 nm |
| Layer 8 | SiO2 | 11 nm |
| Layer 9 | Ta2O5 | 31.7 nm |
| Layer 10 | SiO2 | 4.3 nm |
| Layer 11 | Ta2O5 | 5.9 nm |
| Layer 12 | SiO2 | 81.3 nm |
| Layer 13 | Ta2O5 | 7.94 nm |
| Layer 14 | SiO2 | 61.5 nm |
| Layer 15 | Ta2O5 | 43.7 nm |
| Layer 16 | SiO2 | 5.1 nm |
| Layer 17 | Ta2O5 | 65.5 nm |
| Layer 18 | SiO2 | 85.3 nm |
| Layer 19 | Ta2O5 | 1 nm; | wherein layer 19 is the high refractive index layer situated at an interface between the antireflective coating and air; and wherein the high refractive index layer is a tantalum oxide (Ta2O5) layer, and the low refractive index layer is a silicon dioxide (SiO2) layer.

19. The image sensor package of claim 11, wherein the transparent substrate is a bare glass substrate.

20. The image sensor package of claim 11, wherein the anti-reflective coating is applied to both sides of the transparent substrate.

* * * * *